(12) United States Patent
Gao et al.

(10) Patent No.: US 12,051,885 B2
(45) Date of Patent: Jul. 30, 2024

(54) OR RELATING TO A DISTRIBUTED FEEDBACK LASER DEVICE FOR PHOTONICS INTEGRATED CIRTUIT AND A METHOD OF MANUFACTURE

(71) Applicant: ADVANCED MICRO FOUNDRY PTE. LTD., Singapore (SG)

(72) Inventors: Feng Gao, Singapore (SG); Lianxi Jia, Singapore (SG); Guo Qiang Patrick Lo, Singapore (SG)

(73) Assignee: ADVANCED MICRO FOUNDRY PTE. LTD., Singapore (SG)

( * ) Notice: Subject to any disclaimer, the term of this patent is extended or adjusted under 35 U.S.C. 154(b) by 607 days.

(21) Appl. No.: 17/415,014

(22) PCT Filed: Dec. 26, 2019

(86) PCT No.: PCT/SG2019/050640
§ 371 (c)(1),
(2) Date: Jun. 17, 2021

(87) PCT Pub. No.: WO2020/139197
PCT Pub. Date: Jul. 2, 2020

(65) Prior Publication Data
US 2022/0045482 A1    Feb. 10, 2022

(30) Foreign Application Priority Data
Dec. 28, 2018   (SG) ............................ 10201811773X (51) Int. Cl.
*H01S 5/12* (2021.01)
*H01S 5/02* (2006.01)
(Continued)

(52) U.S. Cl.
CPC ............ *H01S 5/1228* (2013.01); *H01S 5/021* (2013.01); *H01S 5/0215* (2013.01); *H01S 5/026* (2013.01);
(Continued)

(58) Field of Classification Search
CPC ...... H01S 5/1228; H01S 5/021; H01S 5/0215; H01S 5/026; H01S 5/04253; H01S 5/0612; H01S 5/12
See application file for complete search history.

(56) References Cited

U.S. PATENT DOCUMENTS 4,777,148 A * 10/1988 Liau ........................ H01S 5/187
148/DIG. 95
2008/0198888 A1    8/2008 Arimoto

FOREIGN PATENT DOCUMENTS

| CN | 102638000 A | 8/2012 |
|---|---|---|
| CN | 103227265 A | 7/2013 |
| WO | 2016070186 A1 | 5/2016 |

OTHER PUBLICATIONS

International Preliminary Report of Patentability for corresponding application PCT/SG2019/050640 filed Dec. 26, 2019; Mail date Jul. 27, 2020.

(Continued)

*Primary Examiner* — Yuanda Zhang
(74) *Attorney, Agent, or Firm* — Bookoff McAndrews, PLLC (57) ABSTRACT

A distributed feedback laser integrated on silicon comprising a combination of a waveguide of a first material and a laser diode a second material, different from the first material, wherein the laser diode comprises a plurality of regularly spaced metalized grating elements which form a single longitudinal mode; wherein the waveguide comprises a plurality of waveguide elements separated by metalized regions; and wherein the metalized grating elements and the (Continued)

metalized regions are adapted to be coupled to one another to form the distributed feedback laser.

20 Claims, 9 Drawing Sheets (51) Int. Cl.
    *H01S 5/026* (2006.01)
    *H01S 5/042* (2006.01)
    *H01S 5/06* (2006.01)

(52) U.S. Cl.
    CPC ........ *H01S 5/04253* (2019.08); *H01S 5/0612* (2013.01); *H01S 5/12* (2013.01)

(56) References Cited

OTHER PUBLICATIONS

International Search Report for corresponding application PCT/SG2019/050640 filed Dec. 26, 2019; Mail date Mar. 9, 2020.
Written Opinion for corresponding application PCT/SG2019/050640 filed Dec. 26, 2019; Mail date Mar. 9, 2020.

\* cited by examiner

OR RELATING TO A DISTRIBUTED FEEDBACK LASER DEVICE FOR PHOTONICS INTEGRATED CIRTUIT AND A METHOD OF MANUFACTURE

FIELD OF THE INVENTION

The present invention relates to a distributed feedback (DFB) laser and methods of making the same, particularly, but not exclusively for photonics integrated circuits.

BACKGROUND

Silicon has an indirect bandgap, which can lead to difficulties in realizing a laser diode. As a result, integration is required with a III-V diode laser on silicon for photonics integrated circuit. A number of proposal have been made to address the issues. These include for example:

Epitaxial growth of III-V material on Silicon;
A hybrid integration such as molecular bonding;
Heterogeneous integration, using for example adhesive die-to-wafer bonding or metal strip wafer bonding;
Edge coupling integration and grating coupling integration, like flip-chip bonding.

The epitaxial III-V material on silicon is a relatively low-cost solution but the mismatch of lattice parameter causes difficulties in achieving a high performance semiconductor laser epitaxial structure.

Hybrid integration provides long-term stability but still requires both a particle-free and low-roughness surface to obtain void-free bonding which leads to yield issues. This leads to complex processing.

Heterogeneous integration has lower particle and surface roughness sensitivity but still suffers from issues associated with low thermal conductivity.

Edge coupling and grating coupling integration, such as flip-chip bonding requires accurate alignment and thus only allows die-to-die bonding. This adds a level of complexity and restriction.

The problems associated with realizing a laser diode on silicon are thus not yet resolved and a solution is still being sought.

The embodiments described below are not limited to implementations which solve any or all of the disadvantages of the prior art.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

According to an aspect of the invention there is provided a distributed feedback laser integrated on silicon comprising a combination of a waveguide of a first material and a laser diode a second material, different from the first material, wherein the laser diode comprises a plurality of regularly spaced metalized grating elements which form a single longitudinal mode; wherein the waveguide comprises a plurality of waveguide elements separated by metalized regions; and wherein the metalized grating elements and the metalized regions are adapted to be coupled to one another to form the distributed feedback laser.

Preferably, the first material is silicon and the second material comprises a III-V material.

Preferably, the metalized grating elements and the metalized regions are adapted to be bonded to one another to form an internal bonded metal layer.

Preferably, bonding comprises butt coupling.

Preferably, the bonding is achieved by applying force to the push together the waveguide and laser diode in an atmosphere of nitrogen at a predetermined temperature for a predetermined time.

Preferably, the force is between about 0.5 and 3 N.

Preferably, the predetermined temperature is between about 300-500° C.

Preferably, the predetermined temperature is between about 5 and 12 hours.

Preferably, the waveguide act as optical confinement layer along an epitaxial axis of laser.

Preferably, the optical confinement layer of the waveguide is combined with optical confinement layer of laser, forming a combined optical confinement layer.

Preferably, the metal is located on a BOX layer.

Preferably, the metal layer acts as an electrode within the laser

Preferably, the metal has a small absorptive coefficient

According to another aspect of the invention there is provided a method of fabricating a distributed feedback laser integrated on silicon, the method comprising: forming a laser diode from a first type of material and comprising a plurality of regularly spaced metalized grating elements which form a single longitudinal mode; forming a waveguide from a second type of material different from the first material and comprising a plurality of waveguide elements separated by metalized regions; and coupling the metalized grating elements and the metalized regions to one another to form the distributed feedback laser.

Preferably, the first material is silicon and the second material comprises a III-V material.

Preferably, further comprising: forming the additional elements as one of a heating element and a voltage generating element which can cause a change in the refractive index of the defined portion of the waveguide.

Preferably, further comprising: bonding the metalized grating elements and the metalized regions to one another to form an internal bonded metal layer.

Preferably, further comprising: bonding by butt coupling.

Preferably, further comprising: applying a force to the push together the waveguide and laser diode in an atmosphere of nitrogen at a predetermined temperature for a predetermined time.

Preferably, further comprising the force is between about 0.5 and 3 N; the predetermined temperature is between about 300-500° C.; and the predetermined temperature is between about 5 and 12 hours.

Preferably, further comprising forming the waveguide act as optical confinement layer along an epitaxial axis of laser Preferably, further comprising locating the metal on a BOX layer.

The preferred features may be combined as appropriate, as would be apparent to a skilled person, and may be combined with any of the aspects of the invention.

BRIEF DESCRIPTION OF THE DRAWINGS

Embodiments of the invention will be described, by way of example, with reference to the following drawings, in which.

Common reference numerals are used throughout the figures to indicate similar features.

DETAILED DESCRIPTION

Embodiments of the present invention are described below by way of example only. These examples represent the best ways of putting the invention into practice that are currently known to the Applicant although they are not the only ways in which this could be achieved. The description sets forth the functions of the example and the sequence of steps for constructing and operating the example. However, the same or equivalent functions and sequences may be accomplished by different examples.

A distributed feedback (DFB) laser is a type of laser diode in which the active region of the device contains a periodically structured element or diffraction grating. The structure may include a one-dimensional interference grating and the grating provides optical feedback for the laser. The grating may be a Bragg grating or any other appropriate type. The one-dimensional interference grating (also called a longitudinal diffraction grating) has periodic changes in refractive index that cause a reflection back into a cavity of the laser. In a DFB laser, the grating and the reflection is generally continuous along the cavity, instead of just being at the two ends. This alters the modal behavior and makes the laser more stable. There are various designs of DFB lasers, each with slightly different properties.

A laser diode, (LD), injection laser diode (ILD), or diode laser is a semiconductor device similar to a light-emitting diode in which the laser beam creates a junction of the diode. Laser diodes are a very common type of lasers produced, with a wide range of uses that include fiber optic communications, barcode readers, laser pointers, CD/DVD/Blu-ray disc reading/recording, laser printing, laser scanning and light beam illumination.

Figure 1:
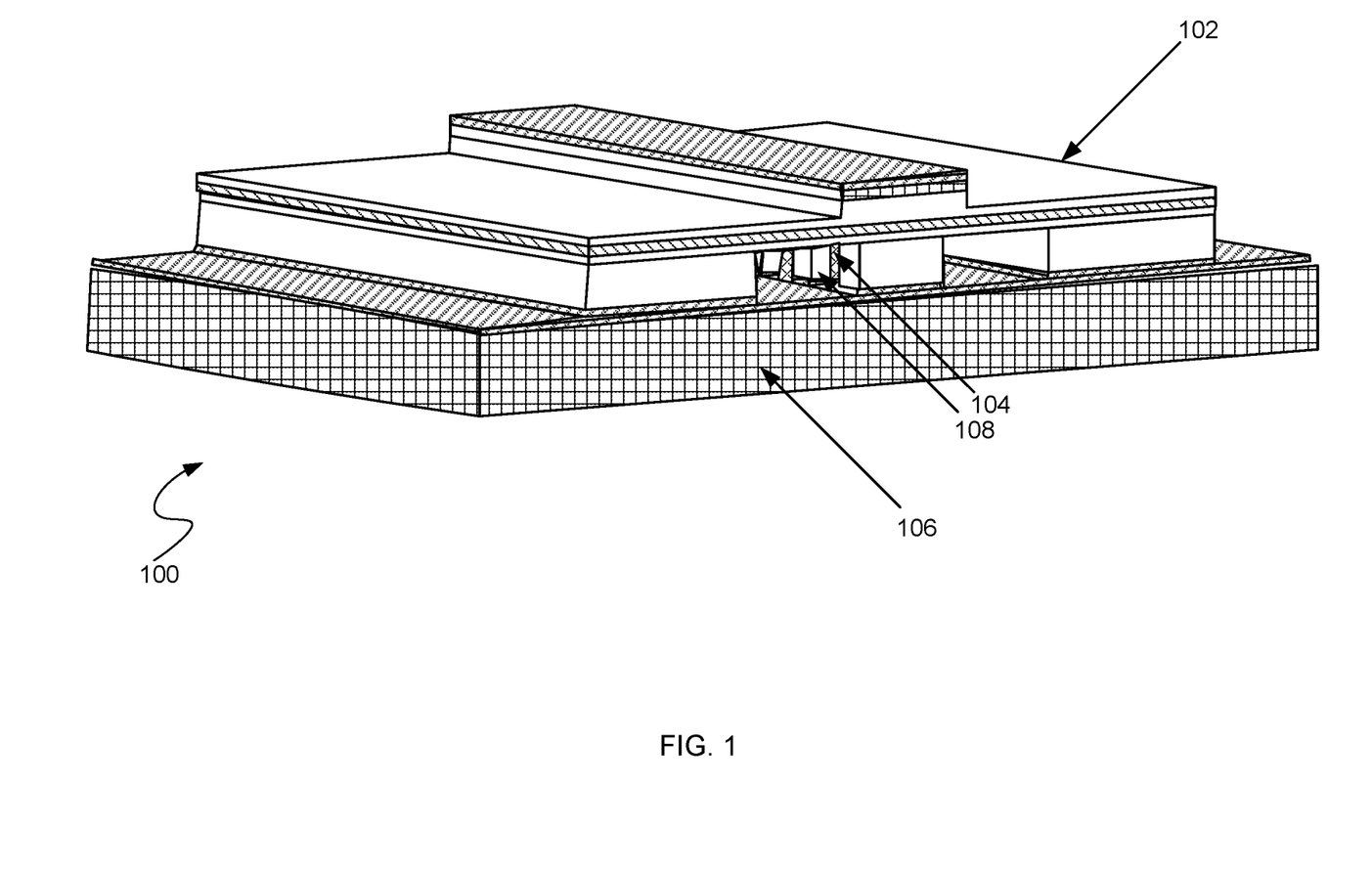
FIG. 1 shows a schematic diagram of a DFB laser according to an embodiment of the present invention.

Referring to FIG. 1, a DFB laser 100 integrated on silicon according to the present invention is shown. The DFB laser comprises a laser diode 102, a waveguide 104, a substrate 106 and a buried oxide (BOX) layer 108. The waveguide 104 is for example Silicon (Si); Silicon Nitride (SiN); Polymer waveguide, Silicon dioxide ($SiO_2$), and/or Tungsten sulfide ($WS_2$). The substrate 106 is made for example from Silicon and the buried oxide (BOX) layer 108 is made for example from $SiO_2$.

Figure 2:
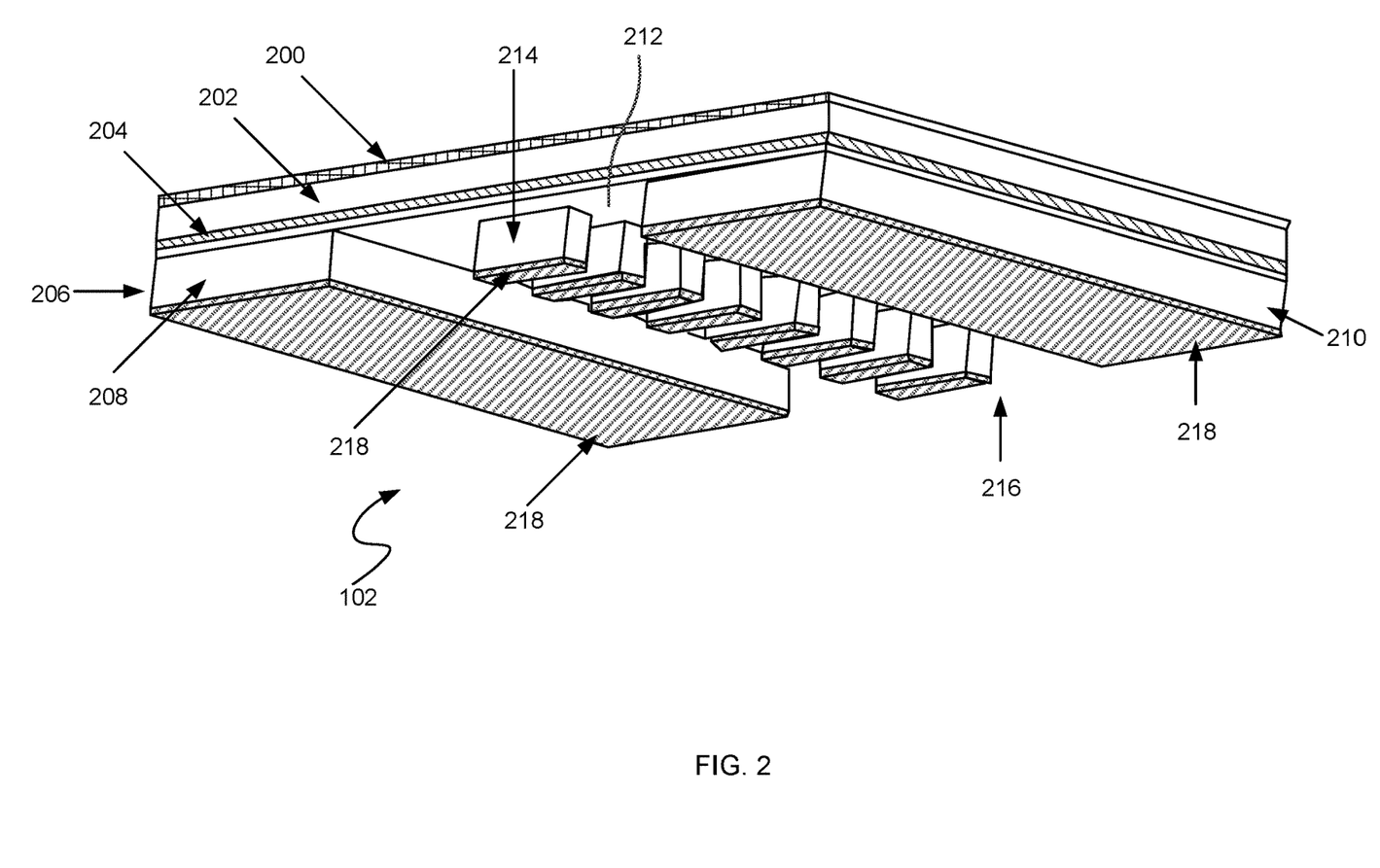
FIG. 2 shows a schematic diagram of the laser diode of the FIG. 1 laser.
Figure 3:
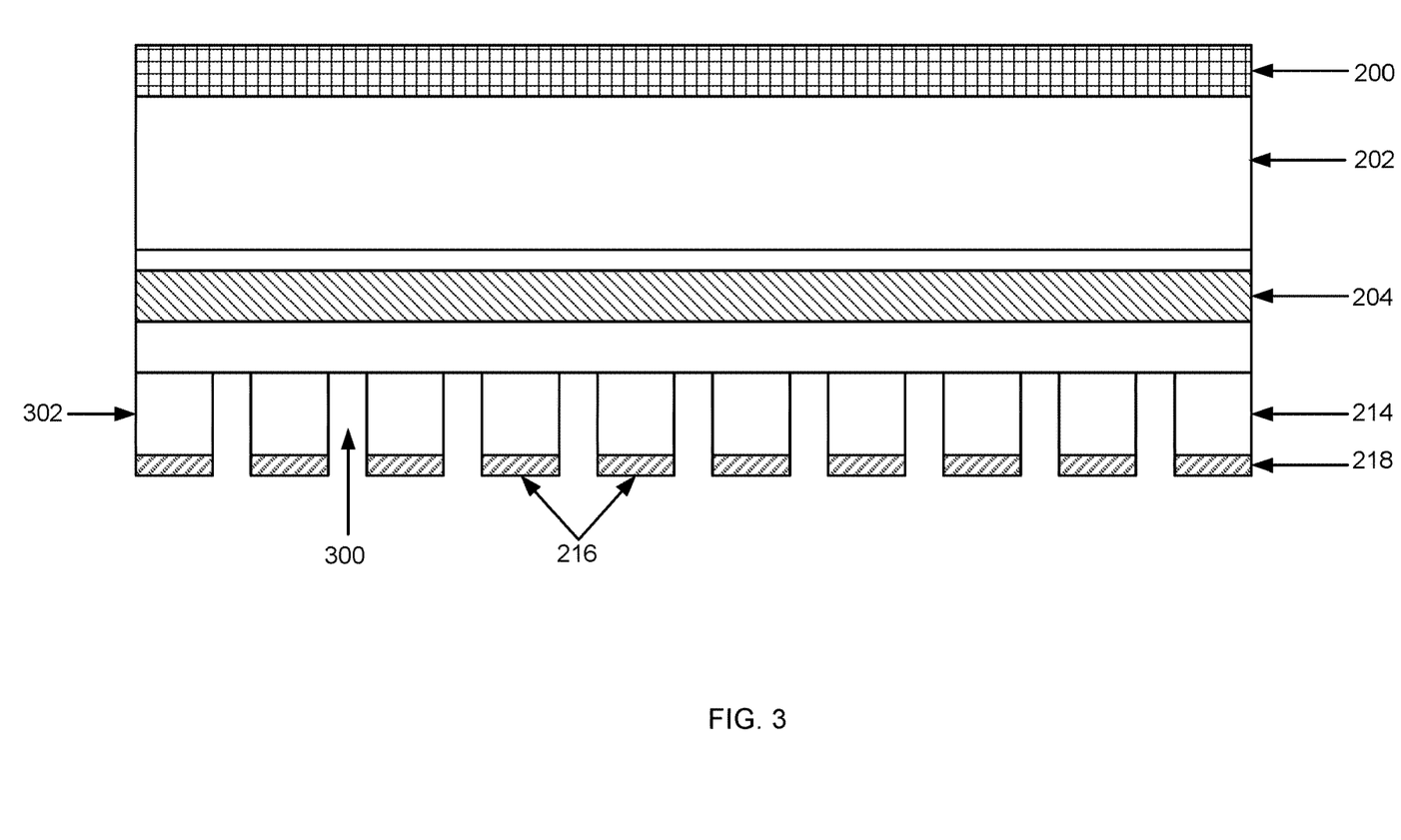
FIG. 3 is a further schematic diagram of the FIG. 2 laser diode.
Figure 4:
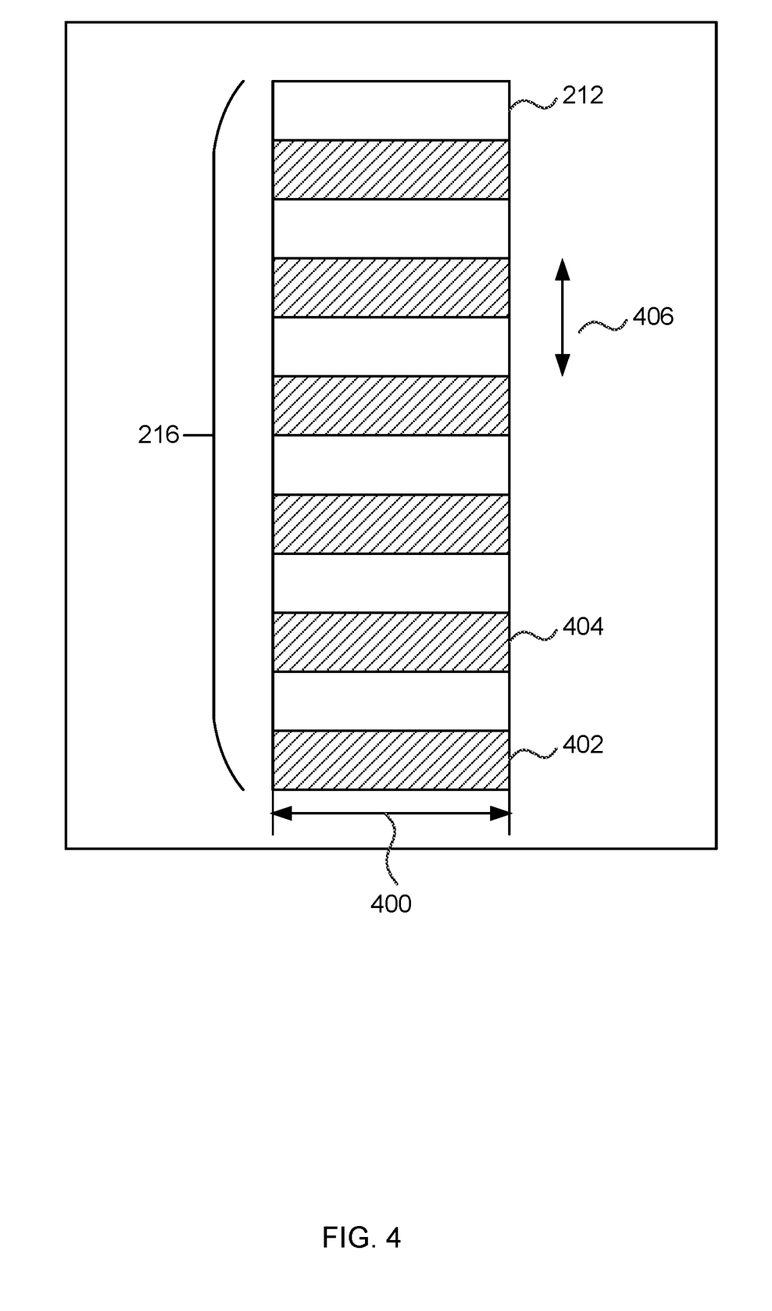
FIG. 4 is a schematic diagram showing a view of FIG. 2 or 3 from above.

Referring to FIGS. 2, 3, and 4 the laser diode 102 will now be described in more detail. The laser diode comprises an n-type substrate 200; an n-type or optical confinement layer 202; and an active or gain layer 204. For a laser diode, when the current is injected, carriers in active layer could recombine to product a photon. The photons form the laser beam. The confinement layer is also referred to as an optical confinement layer. Laterally optical confinement is achieved by the waveguide. For a vertical laser, there is also need for a confinement layer. As the laser beam is produced in the active layer and this layer is very thin, to reduce the energy density on the active layer and to avoid physical damage, the optical confinement layer is used. For a standard III-V laser, the optical confinement layer is normally III-V material. However, in the present invention, one optical confinement layer is III-V material and another is silicon (as described in more detail below). As is known, but for avoidance of doubt a III-V material is a chemical compound with at least one group III element and one group V element as defined by the periodic table.

A p-type confinement layer 206 is then applied having a particular form. This comprises two area 208 and 210 which define a groove 212. Within the groove a plurality of p-type confinement regions 214 are provided being regularly space apart from one another, thereby describing a grating arrangement shown generally as 216. The p-type confinement layer is covered with a layer of metal 218 over the two areas 208 and 210 and the grating arrangement 216. The metal coated grating arrangement is thus made up of a plurality of so called metalized grating elements. The material for the various layers may, by way of example comprise the following: N-type substrate 200: Indium Phosphide (InP); N-type confinement layer 202: AlGaInAs; Active layer 204: InGaAlAs—InGaAsP; P-type confinement layer 206: AlGaInAs; Metal 218: Au—Ge—Ni. Other material having the right properties could be used in replacement of these examples.

Referring to FIG. 3, a cross section of the laser diode 102. The grating arrangement is shown as formed of two parts, namely an etched part 300 and an unetched part 302. The p confinement layer is etched at a regular spacing to expose the active layer for the butt-coupling to the silicon waveguide, as will be described in greater detail below. The metal 218 is applied to the unetched part 302. To reduce the absorption from the metal, the metal is a predetermined space from the active layer 204, thereby leading to smaller absorptive loss. This has sufficient coupling strength to form a single-longitudinal-mode operation. For example, if the metal 218 is AU, Ge or Ni a loss coupling effect is formed thereby, leading to a single longitudinal mode. Where the P-confinement layer is unetched a reduction in the coupling of light in the metal is achieved.

Butt-coupling is a technique of coupling the waveguide to the laser diode to enable efficient coupling of an un-collimated laser beam from the laser diode without the use of additional couplers.

Referring to FIG. 4, a view of the groove 212 and associated grating arrangement 216 is shown from above. The groove has a width 400 of the order of 30 microns and the grating elements 402, 404 etc. are separated 406 by a gap of the order of several microns. The spacing and sizes are given by way of example and are in no way intended to be limiting.

Figure 5:
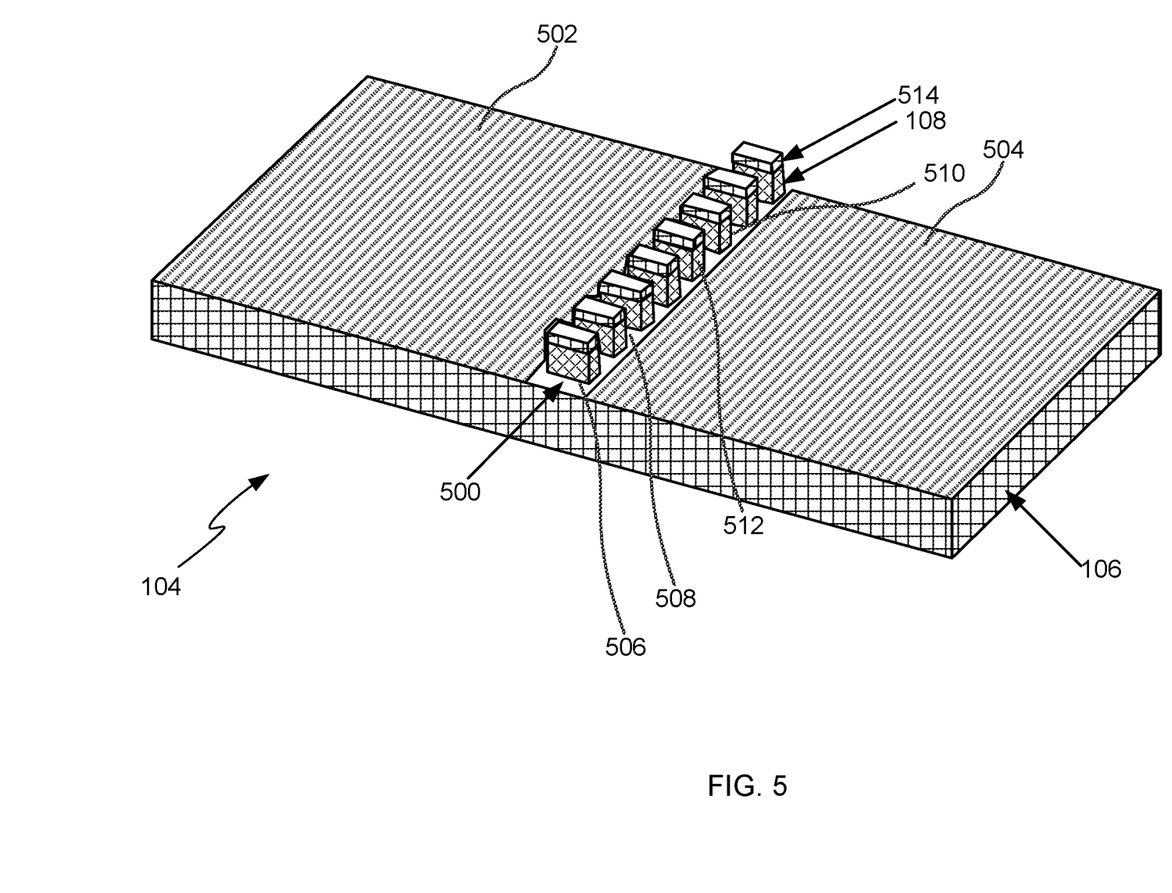
FIG. 5 is a schematic diagram showing a view of the silicon waveguide according to an embodiment of the present invention.
Figure 6:
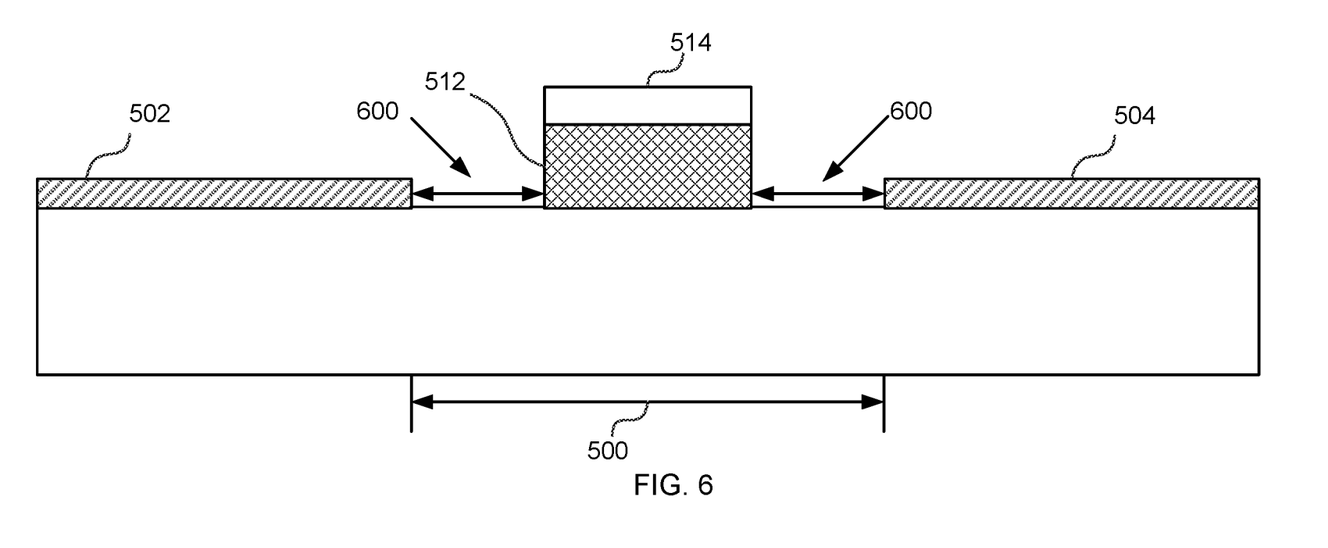
FIG. 6 is a schematic diagram showing certain processing steps for forming the waveguide of FIG. 5.

The silicon waveguide 104 will now be described with reference to FIGS. 5 and 6. As seen more clearly in FIG. 5, the silicon waveguide 104 includes a substrate 106, a groove 500 defined by two metal areas 502 and 504; and a plurality of waveguide elements 506. 508. The waveguide elements are formed from a regularly spaced BOX layer 108 having etched and unetched parts 510 and 512 respectively. The BOX layer is covered with silicon 514 on the unetched parts. The etched and unetched parts 502 and 504 comprise a plurality of waveguide elements separated by metalized areas in the unetched areas. Referring to FIG. 6, the spacing of the etched and unetched parts 510 and 512 match the spacing of the etched and unetched parts of the p-type confinement layer of the diode laser. The BOX element is approximately of the order of 10 microns as are the gaps 600 between the BOX element and the metal areas 502 and 504 respectively.

Figure 7:
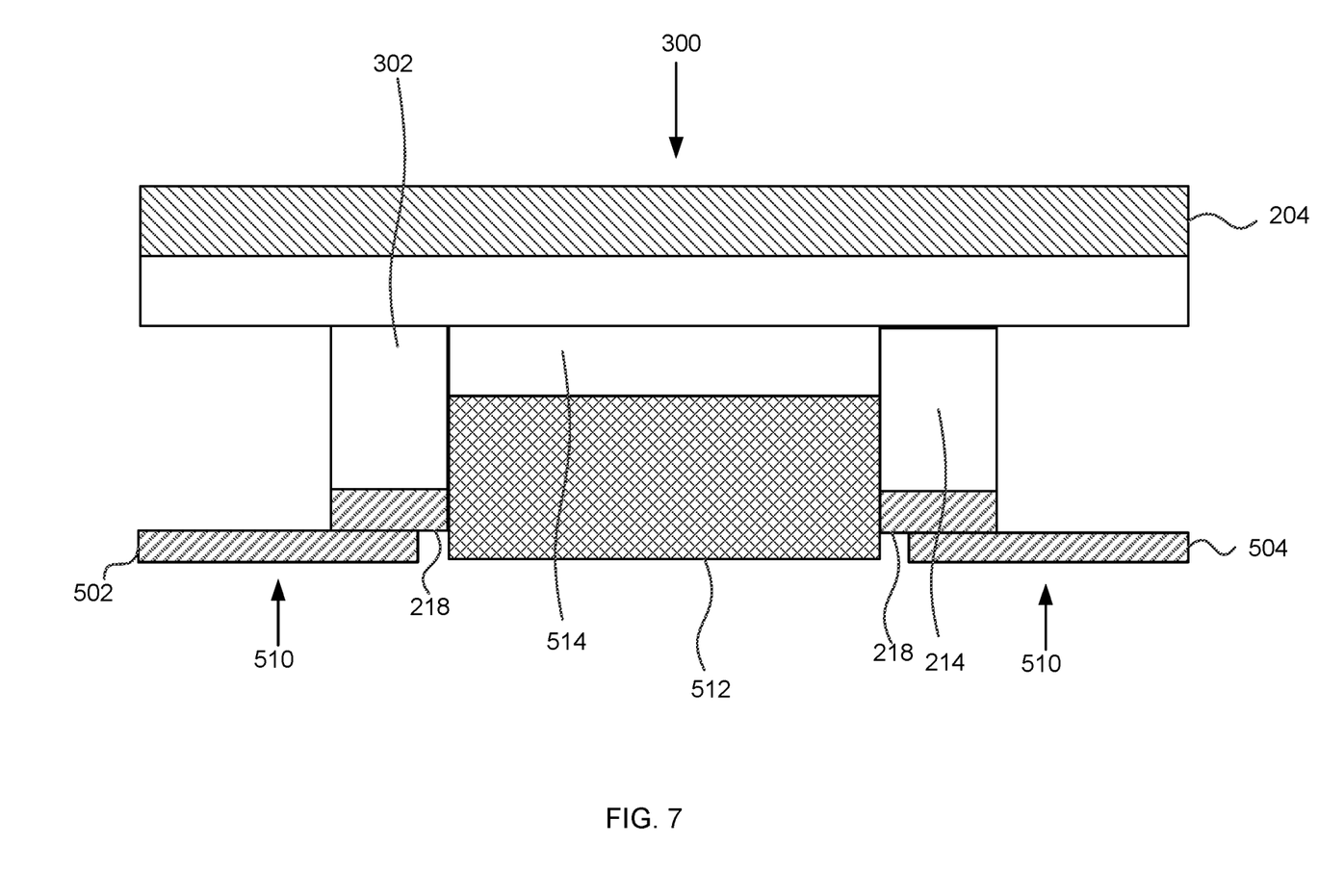
FIG. 7 is a schematic diagram showing a view of the bonding process of the laser diode and the waveguide.
Figure 8:
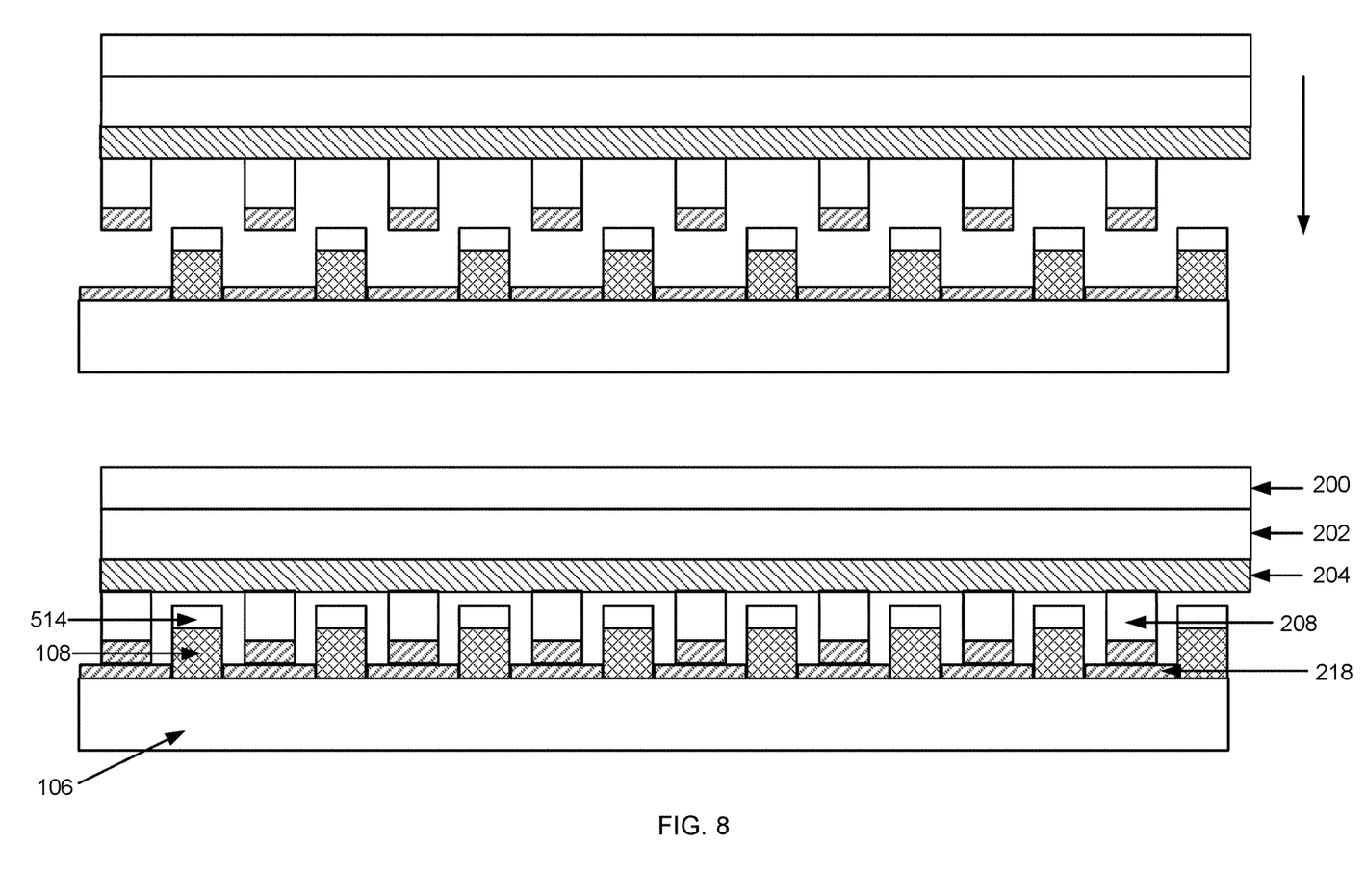
FIG. 8 is a schematic diagram showing a view the FIG. 7 process in greater detail.

Both the laser diode and the silicon waveguide are cleaned prior to a bonding process to combine the two. The bonding process is shown in greater detail in FIGS. 7 and 8. As can be seen in the figures, the matched etched 510 and unetched 512 parts of the silicon waveguide and the etched 300 and unetched 302 parts of the p-type confinement layer of the laser diode cooperate and fit together. The silicon waveguide and diode laser dies, are brought into contact. The bonding occurs between the metal of each part. That is to say the metalized areas 502, 504 on the etched portions of the silicon waveguide and the metalized unetched parts of the of the p-type confinement layer are bonded to one another. The bonding process takes place at a temperature between about 300 and 500° C. in an $N_2$ atmosphere for about 5 to 12 hours. The waveguide and laser are forced together during the heating process at a force of between 0.5 and 3 N. The metal 218 of the diode laser is embedded in the BOX to avoid the metal absorption loss of the silicon waveguide 104. The internal metal bonded layer may serve to improve heat dissipation and may further act as an electrode for the overall assembly.

Figure 9:
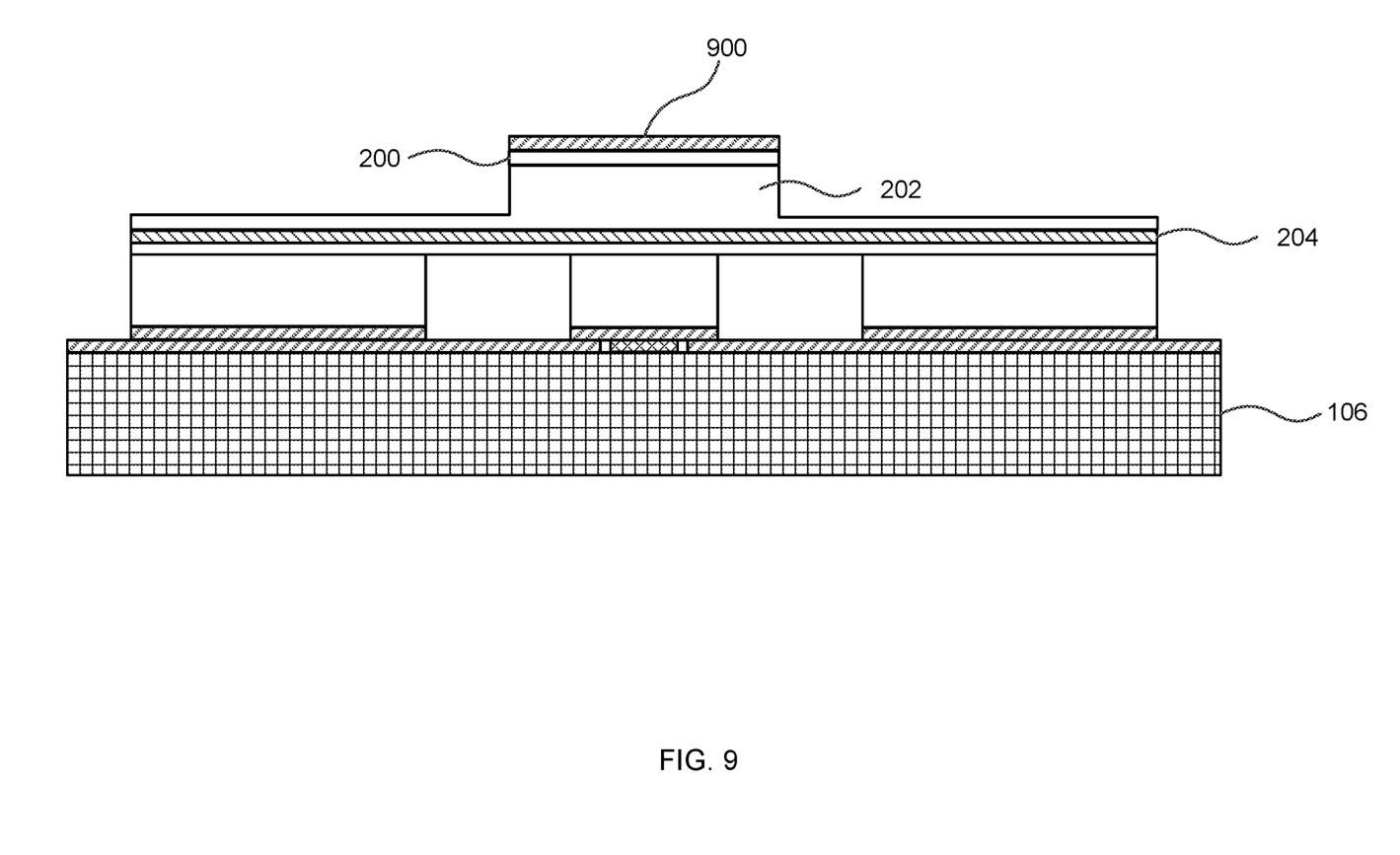
FIG. 9 is a schematic diagram showing a view of the laser after the bonding process.

Referring to FIG. 9, after the bonding process, the n substrate of the laser diode is removed and the ridge on n-cladding and n-confinement layer are formed by lithography and etching so that the required shape is attained. Then, the metal 900 on the ridge is deposited to act as an n-electrode for the overall laser diode assembly. The metal also acts as the electrode.

The present invention provides a novel heterogeneous integration using a metal grating as the bonding layer. Compared with other heterogeneous integration, the metal bonding layer has better ability of heat dissipation. The metal grating does not only act as the bonding layer but also forms the single-longitudinal-mode loss-coupled DFB lasers. As a result; the laser diode is made during the same process and does not need to be made separately, thereby reducing the cost of manufacture. The loss-coupled DFB laser further does not require a shift phase gratings and facet coating as would normally be the case. This is explained in more detail below.

As is known, there are two kinds of DFB lasers. One is an index-coupled DFB lasers and the other is a gain (loss)-coupled DFB lasers. The former, also known as an index-coupled Bragg gratings and may include a feedback effect provided by a periodic change of refractive index. However, there is an intrinsic problem of lasing two degenerated modes. Although high-quality asymmetrical facet coatings may offer a solution, devices continue to suffer from random facet phases. These are hard to control, influencing the single-longitudinal-mode yield. The introduction of a phase shift in gratings also offers a single-longitudinal-mode operation; however, it requires complex fabrication such as the second epitaxy or delicate nanoscale grating fabrication and both the facets in the devices must be anti-reflection coated.

The other type, as provided by the present invention, is a gain-coupled Bragg grating, which is a good choice for achieving a single longitudinal mode, with the feedback effect being provided by a periodic change of the gain (or loss). Gain-coupled gratings can effectively remove mode degeneracy, realizing a high single-longitudinal-mode yield, facet immunity, ultra-low chirping and a high gain margin. These are the key characteristics for photonic devices in practical applications.

The metal 218 on the unetched part 302 is regularly spaced and is referred to as a loss-coupled gratings, which can lead to a periodic absorptive loss.

Overall the DFB laser 100 of the present invention provides a number of advantages over previous lasers. The invention gives rise to a bonding layer formed from the metal gratings which serves to bond the waveguide to the laser diode. The coupling of the laser diode and the silicon waveguide based on the butt-coupling mechanism are combined to form the optical confinement, leading to the transport in the silicon. The laser is produced in the active layer. The silicon waveguide acts as the p optical confinement layer. Hence, the laser may be transmitted in the silicon waveguide. This means the laser could be coupled to the silicon waveguide, via a technique that is sometimes referred to as butt coupling. To reduce the metal loss, the metal is located on the optical confinement layer to reduce the coupling of light in the metal. After bonding, the metal is located in the BOX layer to avoid the effect of metal on silicon waveguide.

The spacing of the metal gratings gives rise to a single-longitudinal-mode loss-coupled distributed feedback laser of a micron scale which is not subject to chirp. The gain-coupled gratings is not related to the spacing. However, to avoid mode-hopping, the spacing is predefined. The present invention is not subject to chirp as there are not two degenerated modes. The silicon waveguide acts as optical confinement layer along the epitaxial axis of DFB laser, and when combined with optical confinement layer of laser provides optical confinement, so that the correct mode gain is achieved for the different modes propagating through the waveguide. In other words, the optical confinement layer of the waveguide is combined with optical confinement layer of laser, forming a combined optical confinement layer. The optical confinement along the laser is achieved by the N-optical confinement layer, the active layer (in which this laser is transmitted) and the silicon waveguide which acts as a further confinement layer. The two confinement layers essentially confine the lasing layer. The laser from the active layer is this coupled to the silicon waveguide via butt coupling offering a highly effective way to couple light from the laser to the silicon waveguide.

The metal is located under the laser waveguide. Which makes the DFB laser 100 more compact and not prone to some of the disadvantages of previous schemes. The metal grating is located along silicon waveguide 104, forming the loss coupled effect and leading to the loss-coupled DFB lasers with single mode. Loss-coupling is one solution to realize single-longitudinal-mode operation. The refractive index has a real part and an imaginary part. The periodic real part of the refractive index gives rise to a single-longitudinal-mode index-coupled DFB laser. The periodic loss means the periodic imaginary part, which could be used to select a longitudinal mode.

The periodic metal grating not only acts as bonding layer, but also lead to loss-coupling effect to form single-longitudinal-mode DFB laser The various elements and structures as described above are made from any appropriate materials suitable for a fabrication process and include for example: for the silicon waveguide, the material may be SiN, Polymer waveguides, Ge:SiO$_2$, WS$_2$ and for diode laser, the material may comprise other III-V materials, such as GaN, GaAs.

The above described steps are very much simplified and it will be appreciated that they are only by way of example. Other and additional processes may occur in order to complete the required device. For example integration into a larger device; the addition of other elements and control circuitry; adaptation of the current steps for different applications, material and sizes of array; etc.

The present invention may include a number of variations and alternatives to the examples described above. These are intended to be encompassed within the scope of the invention.

The invention is specifically for a novel heterogeneous integration of a diode laser and waveguide but may also be used on other integrated devices, such as a photodetector on silicon. In addition, the invention may have uses in at least the following areas: Lidar, datacenter, sensor, narrow-line spectrum device According to an aspect of the invention there is provided a distributed feedback laser integrated on silicon comprising a combination of a waveguide of a first material and a laser diode a second material, different from the first material, wherein the laser diode comprises a plurality of regularly spaced metalized grating elements which form a single longitudinal mode; wherein the waveguide comprises a plurality of waveguide elements separated by metalized regions; and wherein the metalized grating elements and the metalized regions are adapted to be coupled to one another to form the distributed feedback laser.

Preferably, the first material is silicon and the second material comprises a III-V material.

Preferably, the metalized grating elements and the metalized regions are adapted to be bonded to one another to form an internal bonded metal layer.

Preferably, bonding comprises butt coupling.

Preferably, the bonding is achieved by applying force to the push together the waveguide and laser diode in an atmosphere of nitrogen at a predetermined temperature for a predetermined time.

Preferably, the force is between about 0.5 and 3 N.

Preferably, the predetermined temperature is between about 300-500° C.

Preferably, the predetermined temperature is between about 5 and 12 hours.

Preferably, the waveguide act as optical confinement layer along an epitaxial axis of laser.

Preferably, the optical confinement layer of the waveguide is combined with optical confinement layer of laser, forming a combined optical confinement layer.

Preferably, the metal is located on a BOX layer.

Preferably, the metal layer acts as an electrode within the laser

Preferably, the metal has a small absorptive coefficient

According to another aspect of the invention there is provided a method of fabricating a distributed feedback laser integrated on silicon, the method comprising: forming a laser diode from a first type of material and comprising a plurality of regularly spaced metalized grating elements which form a single longitudinal mode; forming a waveguide from a second type of material different from the first material and comprising a plurality of waveguide elements separated by metalized regions; and coupling the metalized grating elements and the metalized regions to one another to form the distributed feedback laser.

Preferably, the first material is silicon and the second material comprises a III-V material.

Preferably, further comprising: forming the additional elements as one of a heating element and a voltage generating element which can cause a change in the refractive index of the defined portion of the waveguide.

Preferably, further comprising: bonding the metalized grating elements and the metalized regions to one another to form an internal bonded metal layer.

Preferably, further comprising: bonding by butt coupling.

Preferably, further comprising: applying a force to the push together the waveguide and laser diode in an atmosphere of nitrogen at a predetermined temperature for a predetermined time.

Preferably, further comprising the force is between about 0.5 and 3 N; the predetermined temperature is between about 300-500° C.; and the predetermined temperature is between about 5 and 12 hours.

Preferably, further comprising forming the waveguide act as optical confinement layer along an epitaxial axis of laser Preferably, further comprising locating the metal on a BOX layer.

Any range or device value given herein may be extended or altered without losing the effect sought, as will be apparent to the skilled person.

It will be understood that the benefits and advantages described above may relate to one embodiment or may relate to several embodiments. The embodiments are not limited to those that solve any or all of the stated problems or those that have any or all of the stated benefits and advantages.

Any reference to 'an' item refers to one or more of those items. The term 'comprising' is used herein to mean including the method blocks or elements identified, but that such blocks or elements do not comprise an exclusive list and a method or apparatus may contain additional blocks or elements.

The steps of the methods described herein may be carried out in any suitable order, or simultaneously where appropriate. Additionally, individual blocks may be deleted from any of the methods without departing from the spirit and scope of the subject matter described herein. Aspects of any of the examples described above may be combined with aspects of any of the other examples described to form further examples without losing the effect sought.

It will be understood that the above description of a preferred embodiment is given by way of example only and that various modifications may be made by those skilled in the art. Although various embodiments have been described above with a certain degree of particularity, or with reference to one or more individual embodiments, those skilled in the art could make numerous alterations to the disclosed embodiments without departing from the spirit or scope of this invention.

The invention claimed is:

1. A distributed feedback laser integrated on silicon comprising a combination of a waveguide of a first material and a laser diode of a second material, different from the first material, wherein the laser diode comprises a plurality of regularly spaced metalized grating elements which form a single longitudinal mode; wherein the waveguide comprises metalized regions separated by a plurality of waveguide elements; and wherein the metalized grating elements and the metalized regions are adapted to be bonded to one another to form an internal bonded metal layer and the distributed feedback laser.

2. The distributed feedback laser according to claim 1, wherein the first material is silicon and the second material comprises a III-V material.

3. The distributed feedback laser according to claim 1, wherein bonding comprises butt coupling.

4. The distributed feedback laser according to claim 1, wherein the bonding is achieved by applying force to push together the waveguide and laser diode in an atmosphere of nitrogen at a predetermined temperature for a predetermined time.

5. The distributed feedback laser according to claim 4, wherein the force is between 0.5 and 3 N.

6. The distributed feedback laser according to claim 4, wherein the predetermined temperature is between 300-500° C.

7. The distributed feedback laser according to claim 4, wherein the predetermined time is between 5 and 12 hours.

8. The distributed feedback laser according to claim 1, wherein the waveguide acts as an optical confinement layer along an epitaxial axis of the laser.

9. The distributed feedback laser according claim 8, wherein the optical confinement layer of the waveguide is combined with an optical confinement layer of laser, forming a combined optical confinement layer.

10. The distributed feedback laser according to claim 1, wherein the internal bonded metal layer is located on a BOX layer.

11. The distributed feedback laser according to claim 1, wherein the internal bonded metal layer acts as an electrode within the laser.

12. The distributed feedback laser according to claim 1, wherein the internal bonded metal layer has a small absorptive coefficient.

13. A method of fabricating a distributed feedback laser integrated on silicon, the method comprising:

forming a laser diode from a second type of material and comprising a plurality of regularly spaced metalized grating elements which form a single longitudinal mode; forming a waveguide from a first type of material different from the second material and comprising metalized regions separated by a plurality of waveguide elements; and bonding the metalized grating elements and the metalized regions to one another to form an internal bonded metal layer and the distributed feedback laser.

14. The method according to claim 13, wherein the first material is silicon and the second material comprises a III-V material.

15. The method according to claim 13, further comprising: forming additional elements as one of a heating element and a voltage generating element which can cause a change in a refractive index of a defined portion of the waveguide.

16. The method according to claim 13, further comprising: bonding by butt coupling.

17. The method according to claim 13, further comprising: applying a force to push together the waveguide and laser diode in an atmosphere of nitrogen at a predetermined temperature for a predetermined time.

18. The method according to claim 17, wherein the force is between 0.5 and 3 N; the predetermined temperature is between 300-500° C.; and the predetermined time is between 5 and 12 hours.

19. The method according to claim 13, further comprising forming the waveguide which is to act as an optical confinement layer along an epitaxial axis of the laser.

20. The method according to claim 17, further comprising locating the internal bonded metal layer on a BOX layer.

* * * * *

UNITED STATES PATENT AND TRADEMARK OFFICE
CERTIFICATE OF CORRECTION

| | | |
|---|---|---|
| PATENT NO. | : 12,051,885 B2 | Page 1 of 1 |
| APPLICATION NO. | : 17/415014 | |
| DATED | : July 30, 2024 | |
| INVENTOR(S) | : Feng Gao et al. | |

It is certified that error appears in the above-identified patent and that said Letters Patent is hereby corrected as shown below:

On the Title Page

In Item (54), delete "OR RELATING TO"

In Item (54), delete "CIRTUIT" and insert --CIRCUIT-- before "AND A METHOD OF MANUFACTURE"

In Item (57), Abstract, Line 3, after "diode" insert --of-- before "a second material"

In the Specification

In Column 1, Line 1, delete "OR RELATING TO"

In Column 1, Line 3, delete "CIRTUIT" and insert --CIRCUIT-- before "AND A METHOD OF MANUFACTURE"

In the Claims

In Column 9, Line 18, in Claim 9, after "according" and before "claim 8" insert --to--

Signed and Sealed this
Fourth Day of February, 2025

Coke Morgan Stewart
*Acting Director of the United States Patent and Trademark Office*